(12) United States Patent
Itoh et al.

(10) Patent No.: US 6,370,288 B1
(45) Date of Patent: Apr. 9, 2002

(54) OPTICAL MAGNETIC FIELD SENSOR PROBE

(75) Inventors: Nobuki Itoh, Katano; Yukiko Yoshikawa, Osaka; Satoshi Ishizuka, Hirakata; Hisashi Minemoto, Ootsu; Daisuke Ishiko, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/384,590

(22) Filed: Aug. 27, 1999

Related U.S. Application Data

(62) Division of application No. 08/803,031, filed on Feb. 19, 1997, now Pat. No. 6,037,770.

(30) Foreign Application Priority Data

Feb. 21, 1996 (JP) ............................................. 8-033233

(51) Int. Cl.⁷ .............................. G02B 6/00; G01R 31/00
(52) U.S. Cl. .............................. 385/12; 385/34; 324/96; 324/244; 324/244.1
(58) Field of Search ................................ 385/6, 12, 34, 385/35; 359/280, 281, 282, 283, 284; 324/96, 244, 246.1

(56) References Cited

U.S. PATENT DOCUMENTS

| 4,745,357 A | | 5/1988 | Miller |
| 4,824,200 A | * | 4/1989 | Isono et al. .................... 385/24 |
| 5,202,629 A | | 4/1993 | Seike et al. |
| 5,321,258 A | * | 6/1994 | Kinney .................. 250/227.21 |
| 5,355,084 A | | 10/1994 | Okajima et al. ......... 324/244.1 |
| 5,485,079 A | | 1/1996 | Itoh |
| 5,699,461 A | * | 12/1997 | Minemoto et al. ............. 385/12 |
| 5,861,741 A | | 1/1999 | Itoh ............................ 324/96 |

FOREIGN PATENT DOCUMENTS

| EP | 0 345 759 | 12/1989 |
| EP | 0 618 456 | 10/1994 |
| JP | 63-06513 | 4/1988 |
| JP | 4-109176 | 4/1992 |
| JP | 6-281903 | 10/1994 |
| JP | 6-342048 | 12/1994 |
| JP | 7-244138 | 9/1995 |
| JP | 7-280900 | 10/1995 |
| JP | 8-15333 | 1/1996 |

OTHER PUBLICATIONS

Patent Abstracts of Japan, vol. 9, No. 224 (P–387), published Sep. 10, 1999, for Japanese Patent Publication No. JP 60080778 to Matsushita Electric Industrial Co., Ltd., published May 8, 1985.
Patent Abstracts of Japan, vol. 11, No. 197 (P–589), published Jun. 25, 1997, for Japanese Patent Publication No. JP–62019819 to Fujitsu Ltd., published Jan. 28, 1987.
Patent Abstracts of Japan, vol. 11, No. 308 (P–624), published Oct. 8, 1987, for Japanese Patent Publication No. JP 62100708 to Fujitsu Ltd., published May 11, 1987.

(List continued on next page.)

Primary Examiner—Hemang Sanghavi
(74) Attorney, Agent, or Firm—Smith, Gambrell & Russell, LLP.

(57) ABSTRACT

An optical magnetic field sensor probe for detecting a magnetic field to be measured as an output light intensity, by disposing a polarizer, a magneto-optical device, and an analyzer mutually different in the transmission and polarization direction with respect to said polarizer, along the running direction of light, has an input optical fiber for feeding into to said polarizer through a first lens, and an output optical fiber for emitting an output light from said analyzer through a second lens, wherein said input optical fiber, said first lens, said magneto-optical device, said second lens and said output optical fiber are composed in a confocal optical system, and said first lens and said second lens are drum lenses.

2 Claims, 15 Drawing Sheets

OTHER PUBLICATIONS

"Optical Magnetic Field Sensors with High Linearity Using Bi–substituted Rare Earth Iron Garnets," by Itoh et al., *1995 Digests of Intermag. International Magnetics Conference*, San Antonio, Apr. 18–21, 1995, Institute of Electrical and Electronics Engineers, p. CD–10 XP00581990.

"Optical Magnetic Field Sensors with High Linearity Using Bi–Substituted Rare Earth Iron Garnets," by Itoh et al., *IEEE Transactions on Magnetics*, vol. 31, No. 6, pp. 3191–3193, dated Nov. 1995.

"Development of a Distribution Line State Monitoring System," by Fudou, et al., *Journal of the Institute of Electrical Engineers of Japan*, vol. 115–B, No. 12 pp. 1447–1454, dated Dec. 1995.

"Improvement of the Linearity of Optical Magnetic Field Sensors," by Itoh et al., *Journal of Japan Society of Applied Magnetics*, vol. 19, No. 2, pp. 209–212, dated Jan. 20, 1995.

"Bi–Substituted Rare–Earth Iron Garnets for Fiber Optic Current Sensors," by Itoh et al., *Technical Report of the Institute of Electronics, Information and Communication Engineers*, OQE92–105, pp. 43–48, dated Sep. 1992.

"Bi–Substituted Rare–Earth Iron Garnets for Fiber Optic Current Sensors," by Itoh et al., *Technical Digest of the 11th Sensor Symposium*, pp. 83–86, dated 1992.

"Optical Magnetic Field Probe Sensor With High Accuracy Using Iron Garnet Films," by Itoh et al., Conference Proceedings, OFS–11 Eleventh International Conference on Optical Fiber Sensors –Advanced Sensing Photonics, pp. 638–640, dated May 21–24, 1996.

* cited by examiner

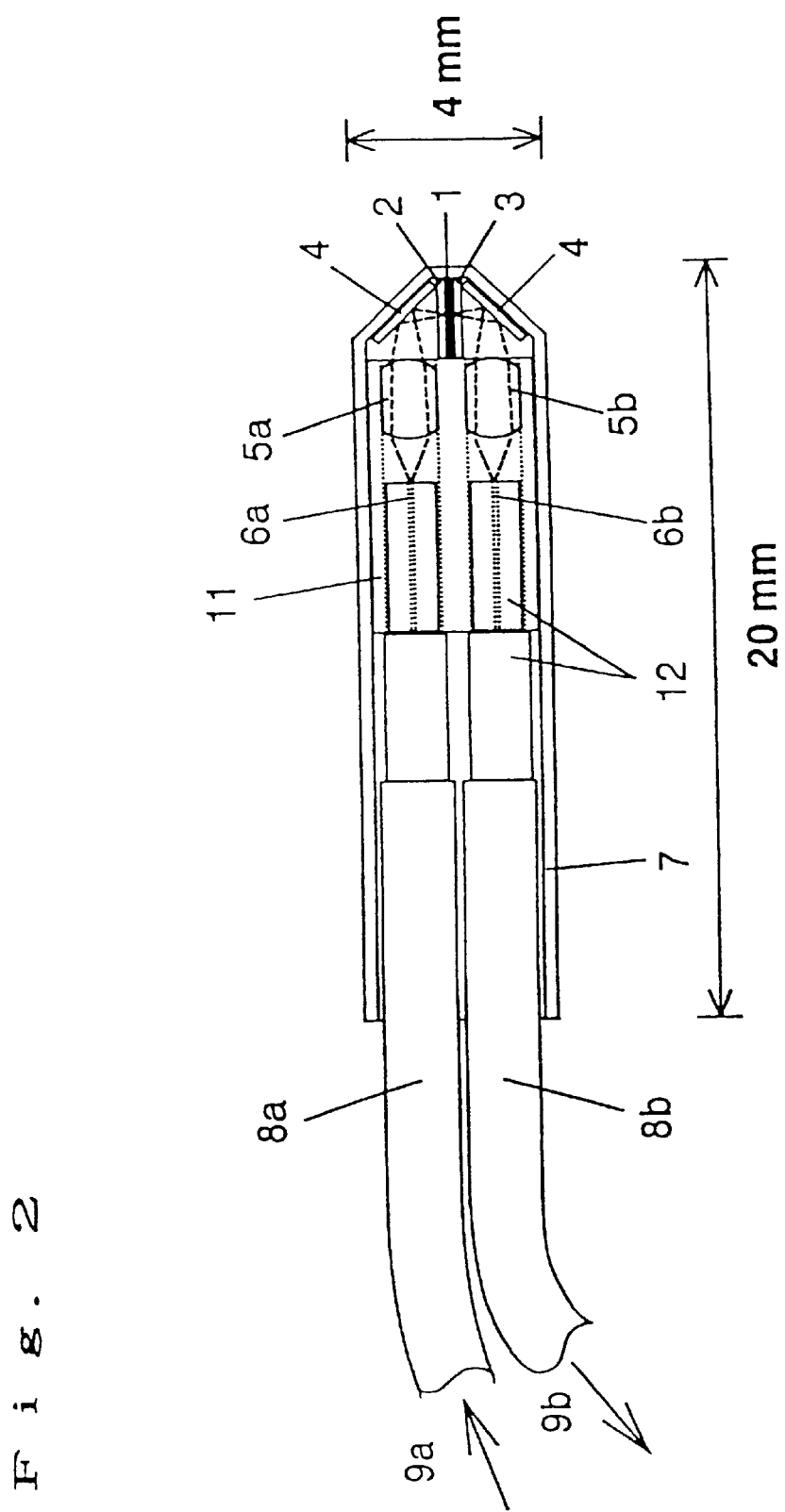

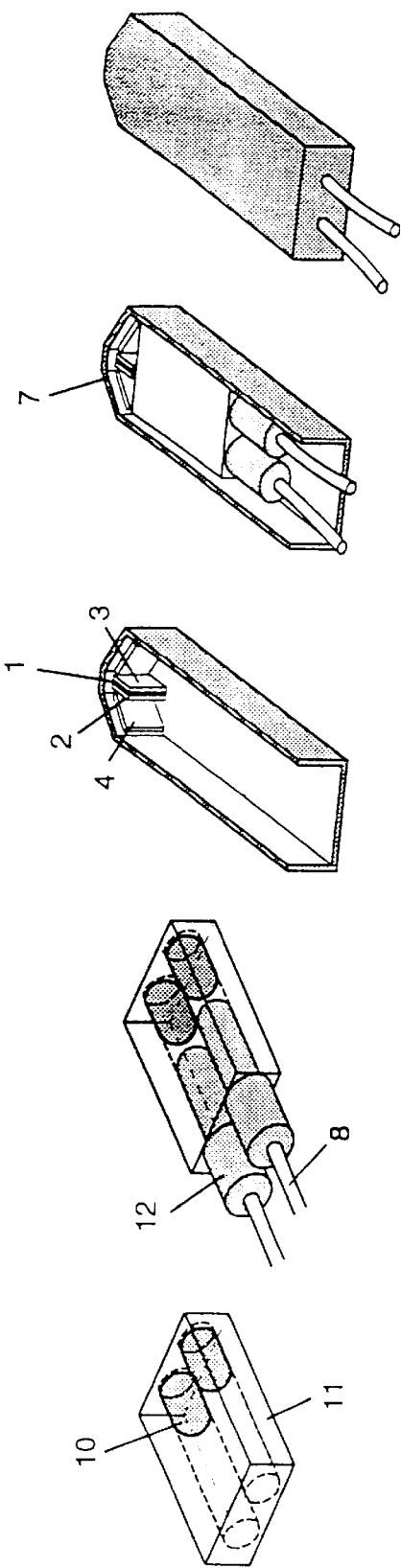

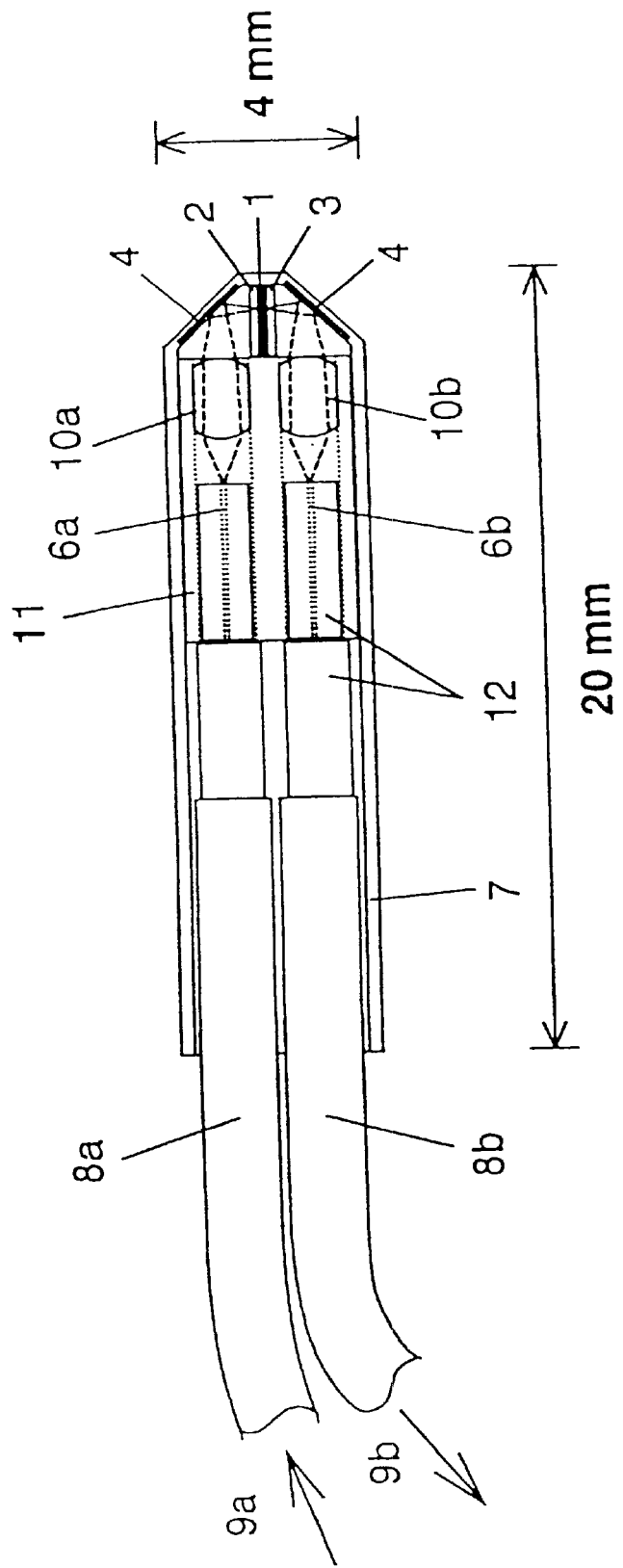

OPTICAL MAGNETIC FIELD SENSOR PROBE

This application is a divisional of U.S. patent application Ser. No. 08/803,031, filed on Feb. 19, 1997 now U.S. Pat. No. 6,037,770, which application is incorporated entirely herein by reference.

BACKGROUND OF THE INVENTION

1. Field of the Invention

The present invention relates to a magneto-optical device using the Faraday effect, and to an optical magnetic field sensor probe for detecting a magnetic field by using the same to measure the intensity of the magnetic field.

2. Related Art of the Invention

As a method of measuring the magnetic field intensity generated around an electric current by using light, an optical magnetic field sensor combining a magneto-optical device having the Faraday effect and optical fiber is known. Such an optical magnetic field sensor provides high insulation and is free from the effects of electromagnetic induction noise, and owing to such advantages, already, it is realized as a sensor for detecting accidents of high voltage distribution lines in the electric power field (Journal of the Institute of Electrical Engineers of Japan, Section B, Vol. 115, No. 12, p. 1447, 1995). Recently, moreover, there is a mounting need for higher performance for this instrument, and an optical magnetic field sensor of high precision and small size is demanded.

As the optical magnetic sensor making use of the Faraday effect, hitherto, the sensor heads as shown in FIGS. 16(a) and 16(b) have been disclosed (see Journal of Japan Society of Applied Magnetics, Vol. 19, No. 2, p. 209, 1995, and IEEE Transactions on Magnetics, Vol. 31, p. 3191, 1995). In FIGS. 16(a) and 16(b), magneto-optical devices 1 of rare earth iron garnet material are disposed in a magnetic field H. The sensor head in FIG. 16(a) constitutes a collimated optical system using collimated lenses 24a, 24b. Herein, the rare earth iron garnet material used as the magneto-optical device 1 measures 3 mm square and 60 μm in film thickness. Optical fibers 6a and 6b are multi-mode optical fibers with a core diameter of 200 μm. In a polarizer 2 and an analyzer 3a, polarizing beam splitters of a 5 mm cube are used, and the polarizer 2 and analyzer 3a are disposed so that the direction of polarization may be mutually different by 45 degrees. The light entering from an input optical fiber 6a is transformed into a parallel light beam by the collimated lens 24a. It is further transformed into a straight polarized light beam by the polarizer 2, and passes through the magneto-optical device 1, and the plane of polarization is rotated in proportion to the intensity of the magnetic field by the Faraday effect. The rotated straight polarized light passes through the analyzer 3a different by 45 degrees in the transmission and polarization direction with respect to the polarizer 2, and is reflected by a total reflection mirror 4, condensed by the collimated lens 24b, and is focused on the output optical fiber 6b. In such an optical system, the analyzer 3a is fixed, the light output from the polarizer 3a is utilized in one port only, and hence it is called the non-differential fixed analyzer method, in which the change in the magnetic field intensity is converted into a change in quantity of light so as to be measurable. In the optical magnetic field sensor shown in FIG. 16(a), of the light diffracted by the multiple-domain structure of rare earth iron garnet material serving as the magneto-optical device 1, only the 0th-order light is received, and therefore it is hitherto unveiled that the increases as the magnetic field becomes higher.

On the other hand, the sensor head in FIG. 16(b) constitutes a confocal optical system using spherical lenses 25a, 25b as the lenses, and forming a beam waist at the position of the magneto-optical device 1. Thus, the light diffracted by the rare earth iron garnet material can be received up to a high order, so that the linearity is improved. In FIG. 16(b), in order to shorten the optical path length so as to form a beam waist at the position of the magneto-optical device 1, a 3 mm square glass polarizing plate is used in the analyzer 3b. The spherical lenses 25a, 25b, are 3 mm in diameter, being made of material BK-7 with a refractive index of 1.517, and the sensor head measures 12 mm in width and 20 mm in length. These optical magnetic field sensors are installed in the gap of an iron core 16 as shown in FIG. 9 (a block diagram of an optical transformer using the optical magnetic field sensor probe of the invention), and used as optical transformers. Therefore, the smaller the width of the sensor head, the narrower the gap that may be formed, so that an optical transformer of high sensitivity may be realized.

As the magneto-optical device 1 used in such a sensor, the rare earth iron garnet material as shown in formula 2 is disclosed (see Technical Research Report of Electronics, Information and Communication Society of Japan, OQE92-105, 1992). In this prior art, by replacing Y with Bi or Gd, a magneto-optical device of excellent temperature characteristic is realized. The chemical formula of the crystal used in this prior art is shown in formula 2.

$$Bi_{1.3}Gd_{0.1}La_{0.1}Y_{1.5}Fe_{4.4}Ga_{0.6}O_{12}$$ (Formula 2)

The linearity and temperature characteristic of the optical magnetic field sensor shown in FIG. 16(b) fabricated by using this magneto-optical device are shown in FIG. 17 and FIG. 18. As shown in FIG. 17, a favorable linearity of 1.0% or less is realized in a magnetic field range of about 25 Oe to 300 Oe. However, to measure a weak magnetic field of less than 25 Oe, the linearity error is large, and a practical problem is noted. The measuring range is narrow, only up to 300 Oe, and an optical magnetic field sensor having a wider measuring range is desired. FIG. 18 shows the result of measuring changes of sensitivity depending on temperature by using two kinds of sensor optical systems, that is, the collimated optical system shown in FIG. 16(a) and the confocal optical system shown in FIG. 16(b), by using the magneto-optical device shown in formula 2. The change rate of sensitivity is normalized by room temperature, and the applied magnetic field is an alternating-current magnetic field of 50 Oe and 60 Hz. In the optical magnetic field sensor shown in FIG. 16(a) composed of the collimated optical system for receiving 0th-order diffracted light only as indicated by bullet marks in FIG. 18, the temperature dependent change of sensitivity of 1.0% or less is obtained. However, in the case of using the magneto-optical device shown in formula 2 in the optical magnetic field sensor shown in FIG. 16(b), a positive characteristic of about 10% of temperature dependent sensitivity change rate is shown as indicated by blank circle marks in FIG. 18. That is, the optical magnetic field sensor in FIG. 16(b) is excellent in linearity, but has a serious problem in the temperature characteristic of the sensitivity.

Therefore, in the prior art, an optical magnetic field sensor satisfying the contradictory problems of favorable linearity and favorable temperature characteristic cannot be realized. Accordingly, an optical magnetic field sensor of smaller size and higher precision is demanded.

SUMMARY OF THE INVENTION

The invention is devised to solve such problems of the conventional optical magnetic field sensor, and it is an object thereof to present an optical magnetic field sensor high in measuring precision, small in size, and easy to assemble, while satisfying the requirements of excellent linearity and temperature characteristic, and wide measuring range.

To solve the above problems, the invention constitutes an optical magnetic field sensor probe of very small size, that improves the linearity in a wide measuring range, and further improves the temperature characteristic by employing a specific material composition.

To realize a sensor head of small size, drum lenses are formed by using spherical lenses of high refractive index and polishing of their peripheral area, and two drum lenses are fixed to a holder to fabricate a novel small-sized drum lens holder. Using such a drum lens holder, an optical magnetic field sensor of 4 mm in width is constituted.

Moreover, as the magneto-optical device to be used in this optical magnetic field sensor probe, a rare earth iron garnet material is presented, which is expressed in the following formula 1, where the value of x is defined in a range of $0.84 \leq x \leq 1.10$, the value of y in a range of $0.73 \leq y \leq 1.22$, the value of z in a range of $0.02 \leq z \leq 0.03$, and the value of w in a range of $0.27 \leq w \leq 0.32$.

$$(Bi_xGd_yR_zY_{3-x-y-z})(Fe_{5-w}Ga_w)O_{12} \quad \text{(Formula 1)}$$

where R is at least one element selected from the rare earth elements.

Further, to improve the linearity of a low magnetic field, taking note of the magnitude of the magnetic field coercive force (Hw) of the rare earth iron garnet material, a rare earth iron garnet material of small magnetic wall coercive force is manufactured in order to decrease the linearity error. For this purpose, herein, the dependence of the magnetic wall coercive force on the film thickness and annealing effect have been discovered. According to the present invention, the magnetic wall coercive force can be decreased by properly regulating the film thickness in a certain composition of rare earth iron garnet material. Also by heat treatment of the rare earth iron garnet material expressed in formula 1 at a high temperature, the magnetic wall coercive force can be decreased. The rare earth iron garnet material thus optimized in film thickness and heat treatment of the film is applied in the optical magnetic field sensor probe as the magneto-optical device.

The action and effect of the invention having such constitution are described below. By the constitution of the invention, the width of the optical magnetic field sensor is extremely reduced, and the number of parts is smaller, so that its assembly is easier. In particular, by the use of the drum lens holder, the reliability is also enhanced. According to the optical magnetic field sensor probe of the invention, the qap interval of the void iron core can be decreased. Therefore, an optical transformer of high sensitivity to input current is realized. At the same time, the head of the optical transformer can be also formed with a very small size.

Furthermore, the magneto-optical device of the invention is used in the optical system for receiving diffracted light up to a high order by a multiple domain structure of the magneto-optical device. That is, by constituting the optical magnetic field sensor probe by using the magneto-optical device of the invention, diffracted light of high order can be received, so that a sensor of excellent linearity can be realized. Moreover, since the saturation magnetic field of the magneto-optical device is designed to be larger than in the conventional magneto-optical device, it is possible to measure with excellent linearity up to a high magnetic field. A superior temperature characteristic is further realized by using a specific composition of rare earth iron garnet material for the optical magnetic field sensor probe of the invention. Thus, the optical magnetic field sensor probe of small size and high precision is realized.

BRIEF DESCRIPTION OF THE DRAWINGS

FIG. 2 is a diagram showing another embodiment of an optical magnetic field sensor probe according to the invention.

FIGS. 3B(a)–3B(e) are diagrams showing the steps of the assembly process of the optical magnetic field sensor probe for a second embodiment of the invention.

FIG. 4 is a diagram showing yet another embodiment of an optical magnetic field sensor probe according to the invention.

Figure 1:
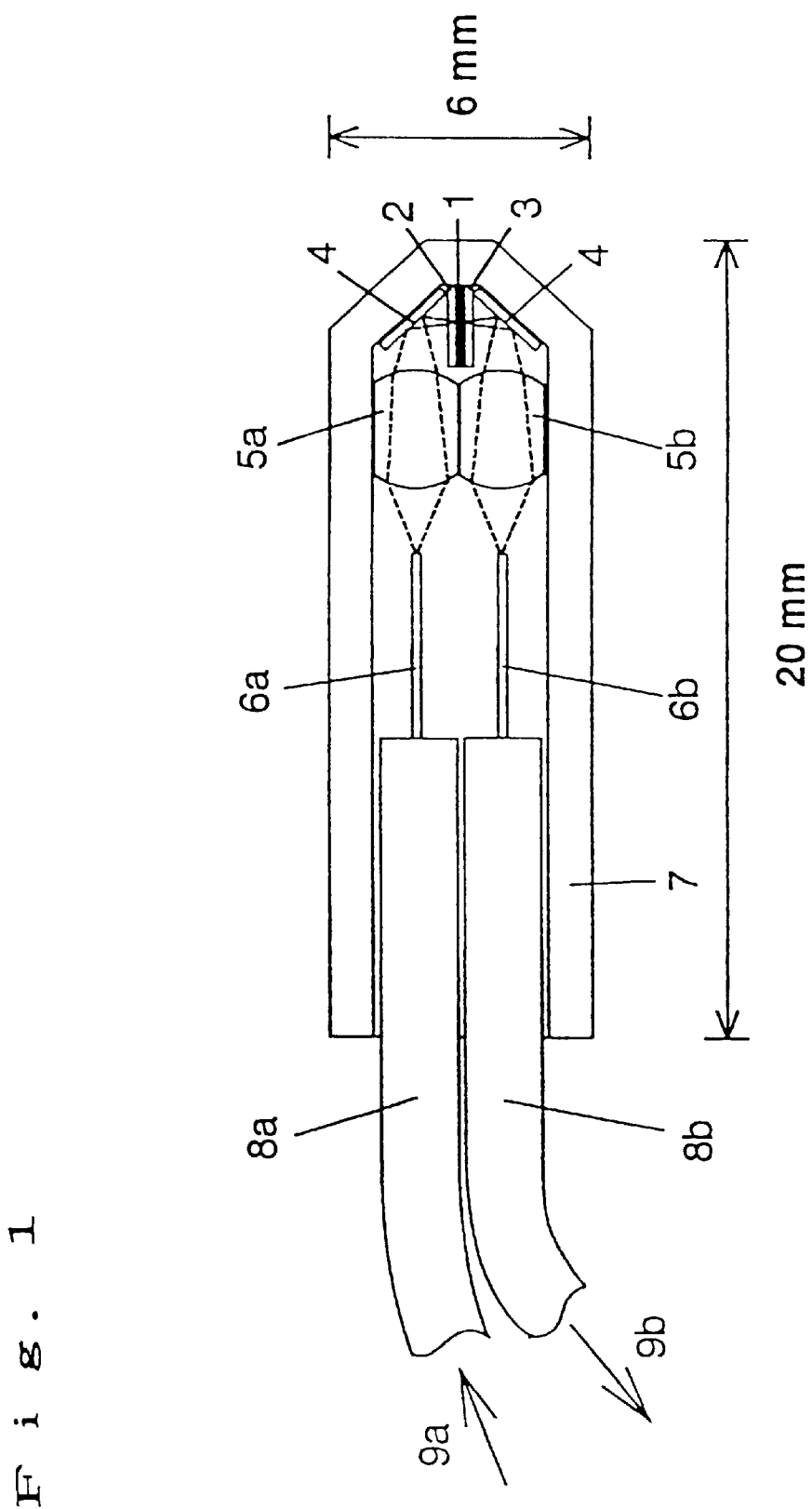
FIG. 1 is a diagram showing an embodiment of an optical magnetic field sensor probe according to the invention.

| REFERENCE NUMERALS | |
|---|---|
| 1 | Magneto-optical device |
| 2 | Polarizer |
| 3 | Analyzer |
| 4 | Total reflection mirror |
| 4a | Evaporated total reflection mirror |
| 5a, 10a | Input side drum lenses |
| 5b, 10b | Output side drum lenses |
| 6a | Input optical fiber |
| 6b | Output optical fiber |
| 7 | Sensor case |
| 8a, 8b | Input and output optical fiber cords |
| 9a | Input light |
| 9b | Output light |
| 11 | Drum lens holder |
| 12 | Ferrule |
| 13a, 13b | Bent hemispherical-ended optical fibers |
| 14a, 14b | Bent optical fibers for holding plane of polarization |
| 15a, 15b | Plastic optical fibers |
| 16 | Void iron core |
| 17 | Optical magnetic field sensor probe |
| 18 | Signal processing circuit |
| 19 | Conductor |
| 20 | Substrate |
| 21 | Rare earth iron garnet material (grown film) |
| 22 | SGGG crystal substrate |
| 23 | Ceramic tray |
| 24a, 24b | Collimated lenses |
| 25a, 25b | Spherical lenses |

PREFERRED EMBODIMENTS

Referring now to the drawings, embodiments of the invention are described in detail below.

A first embodiment of the invention relates to an optical magnetic field sensor probe for detecting a magnetic field to be measured as an output light intensity, by disposing a polarizer, a magneto-optical device, and an analyzer mutually different in the transmission and polarization direction with respect to the polarizer, along the running direction of a light path. The embodiment also comprises an input optical fiber for feeding light into to the polarizer through a first lens, and an output optical fiber for emitting an output light from the analyzer through a second lens, wherein the input optical fiber, the first lens, the magneto-optical device, the second lens and the output optical fiber are composed in a confocal optical system, and the first lens and the second lens are drum lenses.

A second embodiment of the invention relates to an optical magnetic field sensor probe for detecting a magnetic field to be measured as an output light intensity, by disposing a polarizer, a magneto-optical device, and an analyzer mutually different in the transmission and polarization direction with respect to the polarizer, along the running direction of a light path. The second embodiment also comprises an input optical fiber for feeding light into to the polarizer through a first lens, and an output optical fiber for emitting an output light from the analyzer through a second lens, wherein the input optical fiber, the first lens, the magneto-optical device, the second lens and the output optical fiber are composed in a confocal optical system, and a lens holder is disposed for incorporating the first lens and the second lens.

A third embodiment of the invention relates to an optical magnetic field sensor probe, wherein the first lens and the second lens are lenses having a refractive index of 1.517 or more.

A fourth embodiment of the invention relates to an optical magnetic field sensor probe for detecting a magnetic field to be measured as an output light intensity, by disposing a polarizer, a magneto-optical device, and an analyzer mutually different in the transmission and polarization direction with respect to the polarizer, along the running direction of a light path. The fourth embodiment also comprises an input optical fiber for feeding light into the polarizer through a first lens and a first mirror, and an output optical fiber for emitting an output light from the analyzer through a second lens and a second mirror, wherein the input optical fiber, the first lens, the first mirror, the magneto-optical device, the analyzer, the second lens, and the output optical fiber are composed in a "コ" (which is コ of Japanese katakana)-shaped optical system, and the first mirror and the second mirror are formed by being directly evaporated to a case incorporating the optical system.

A fifth embodiment of the invention relates to an optical magnetic field sensor probe for detecting a magnetic field to be measured as an output light intensity, by disposing a polarizer, a magneto-optical device, and an analyzer mutually different in the transmission and polarization direction with respect to the polarizer, along the running direction of a light path, wherein an input optical fiber provided at one end of the magneto-optical device across from the polarizer, and an output optical fiber provided at the other end of the magneto-optical device across from the analyzer are optical fibers having a lens directly at the front end.

A sixth embodiment of the invention relates to an optical magnetic field sensor probe, wherein the optical fibers are optical fibers bent at the front end.

A seventh embodiment of the invention relates to an optical magnetic field sensor probe for detecting a magnetic field to be measured as an output light intensity, by disposing an input optical fiber having a function for holding a plane of polarization, a magneto-optical device, and an output optical fiber having a function of holding a plane of polarization different from the direction of polarization of the input optical fiber, along the running direction of the light path.

An eighth embodiment of the invention relates to an optical magnetic field sensor probe, wherein the optical fibers for holding the planes of polarization are bent at the front end.

A ninth embodiment of the invention relates to an optical magnetic field sensor probe for detecting a magnetic field to be measured as an output light intensity, by disposing an input optical fiber, a polarizer, a magneto-optical device, an analyzer mutually different in the transmission and polarization direction with respect to the polarizer, and an output optical fiber, along the running direction of the light path, wherein the input optical fiber and the output optical fiber are all-plastic optical fibers.

A tenth embodiment of the invention relates to an optical magnetic field sensor probe, wherein the all-plastic optical fibers are bent at the front end.

An eleventh embodiment of the invention relates to a magneto-optical device using a rare earth iron garnet material, wherein the rare earth iron garnet material is expressed in the following formula, where the value of x is defined in a range of $0.84 \leq x \leq 1.10$, the value of y in a range of $0.73 \leq y \leq 1.22$, the value of z in a range of $0.02 \leq z \leq 0.03$, and the value of w in a range of $0.27 \leq w \leq 0.32$.

$$(Bi_xGd_yR_zY_{3-x-y-z})(Fe_{5-w}Ga_w)O_{12} \qquad \text{(Formula 1)}$$

where R is at least one element selected from the rare earth elements.

A twelfth embodiment of the invention relates to a magneto-optical device, wherein the rare earth iron garnet material is formed by epitaxial growth on a garnet crystal substrate.

A thirteenth embodiment of the invention relates to a magneto-optical device, wherein the garnet crystal substrate is a Ca—Mg—Zr substituent type $Gd_3Ga_5O_{12}$ substrate.

A fourteenth embodiment of the invention relates to a magneto-optical device, wherein the rare earth iron garnet material is heat-treated.

A fifteenth embodiment of the invention relates to a magneto-optical device, wherein the magnetic wall coercive force of the rare earth iron garnet material is 0.2 Oe or less.

The invention is further described below by referring to the embodiments in detail.

Embodiment 1

FIG. 1 is a diagram showing an optical magnetic field sensor probe according to a first embodiment of the invention. A magneto-optical device 1 in FIG. 1 is made of a rare earth iron garnet material expressed in formula 1. The broken line in FIG. 1 shows the traces of rays of light, which indicate a confocal optical system. To reduce the width of the sensor head, drum lenses 5a and 5b of 3 mm in lens radius and 2 mm in drum diameter, being made of material BK-7 (refractive index 1.517), are used. A polarizer 2 and an analyzer 3 are 2 mm square glass polarizing plates, and total reflection mirrors 4 are 2 mm square dielectric multi-layer film evaporation mirrors. Optical fibers 6a and 6b are multi-mode optical fibers with a core diameter of 200 $\mu$m. As shown in FIG. 1, by fixing the constituent components in a case 7, an optical magnetic field sensor probe of a small size of 6 mm in width, half of the conventional size, is realized.

Figure 9:
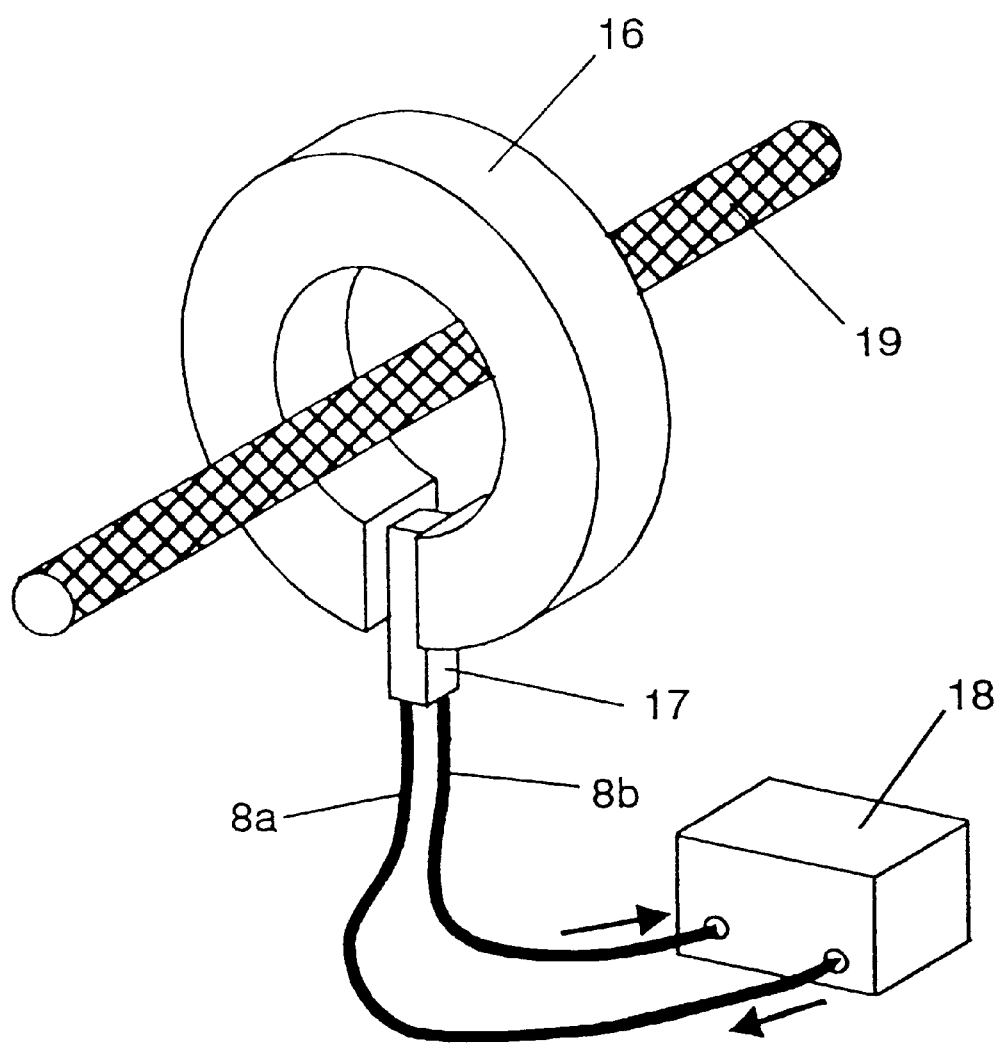
FIG. 9 is a block diagram of an optical transformer using an optical magnetic field sensor probe according to the invention.

A beam 9a emitted from a light source of a signal processing circuit 18 in FIG. 9 is guided into the sensor head through an optical fiber cord 8a, and enters from the optical fiber 6a. The incident light is condensed by the drum lens 5a, and the optical path is bent to 90 degrees by the total reflection mirror 4 to be formed into a straight polarized light by the polarizer 2, and it passes through the magneto-optical device 1. At this time, the incident light 9a forms a beam waist at the position of the magneto-optical device 1. When a magnetic field is applied vertically to the film surface of the magneto-optical device 1, the plane of polarization of the light is rotated by Faraday's rotation. Since the axes of polarization of the polarizer 2 and analyzer 3 are angularly configured by a mutual rotation of 45 degrees, the magnetic field intensity is converted into a light intensity. The light passing through the analyzer 3 is bent again in the optical path to 90 degrees by the total reflection mirror 4, and is condensed by a drum lens 5b, and is focused on an optical fiber 6b.

In this optical magnetic field sensor probe, the optical configuration of the input optical fiber 6a, the magneto-optical device 1, and of the magneto-optical device 1 and output optical fiber 6b is a confocal optical system through the lenses, and is composed almost linearly symmetrically on both sides of the magneto-optical device 1. In this way, by composing a confocal optical system linearly symmetrical to the magneto-optical device 1, the diffracted light of the magneto-optical device having magnetic domains can be received up to a high-order beam, and a sensor of excellent linearity is realized.

Embodiment 2

Figure 3A:
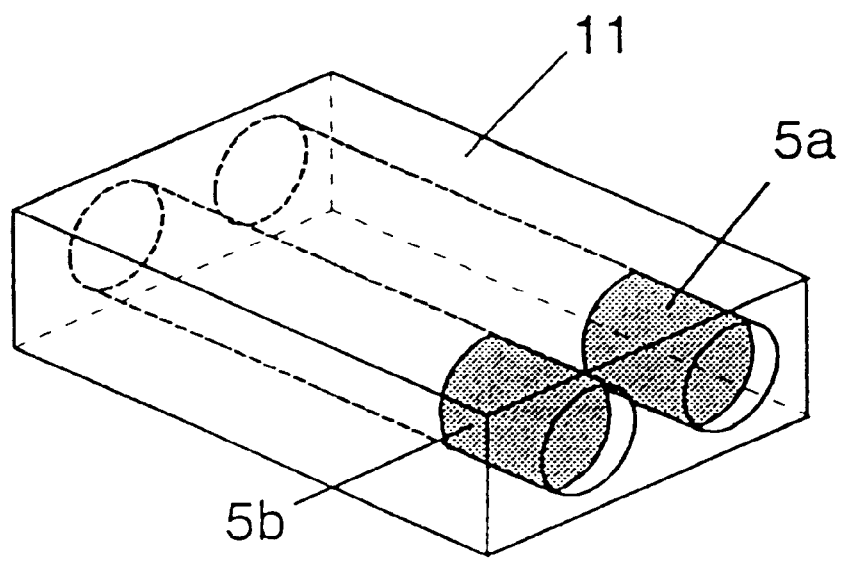
FIG. 3A is an outline diagram of a drum lens holder according to the invention.

FIG. 2 is a diagram showing an optical magnetic field sensor probe according to a second embodiment of the invention. The optical magnetic field sensor probe in FIG. 2 differs from the sensor in FIG. 1 in the condenser lenses, which are drum lenses 5a and 5b of material SF-8 (refractive index 1.689), lens radius of 2 mm, and drum diameter of 1.25 mm. Further differently, input side drum lens 5a and output side drum lens 5b are incorporated in a ceramic or non-magnetic stainless steel holder 11. The drum lens incorporated holder 11 is shown in FIG. 3A. In the parallel penetration holes of the holder, the two drum lenses 5a, 5b are fixed.

FIGS. 3B(a)–3B(e) are diagrams showing the assembly process of the optical magnetic field sensor probe according to the second embodiment of the invention. The drum lens holder 11 has two drum lenses 10 inside guide holes (FIG. 3B). When assembling, after adhering the optical fiber to a ferrule 12, the end surface of the ferrule is polished precisely. The optical fiber cord 8 fixed to the ferrule 12 is inserted into the drum lens holder 11 shown in FIG. 3B(a) ,and is adhered and fixed (FIG. 3B(b)). On the other hand, by making use of the bottom and wall of the inside of the case 7, the magneto-optical element 1, polarizer 2, analyzer 3, and total reflection mirror 4 are fixed preliminarily (FIG. 3B(c)). Finally, the drum lens holder 11 fixing the optical fiber cord 8 is fixed at a specified position of the case 7 (FIG. 3B(d)), and the optical magnetic field sensor probe is completed(FIG. 3B(e)). In this way, by using the drum lens holder 1 which was not used conventionally, adjustment of the optical axes is easy and reliability is much improved. As compared with embodiment 1, the size is much smaller. The optical magnetic field sensor probe shown in FIG. 2 measures 4 mm in width and 20 mm in length.

Moreover, when using a drum lens of material TaF-3 having a higher refractive index (1.804) in a confocal optical system, the distance between the input side lens 5a and output side lens 5b can be shortened, and the probe width is further reduced.

Embodiment 3

FIG. 4 is a diagram showing an optical magnetic field sensor probe according to a third embodiment of the invention. The optical magnetic field sensor probe in FIG. 4 differs from the sensor in FIG. 2 in the formation of the mirrors by directly evaporating the dielectric multi-layer film to the inside of the case 7 in order to further decrease the number of parts. In this constitution, the step for adhering the dielectric multi-layer film evaporation mirrors 4 to the case 7 is omitted, and the assembling in embodiment 2 is further simplified, and the practical reliability is further enhanced.

Embodiment 4

Figure 5:
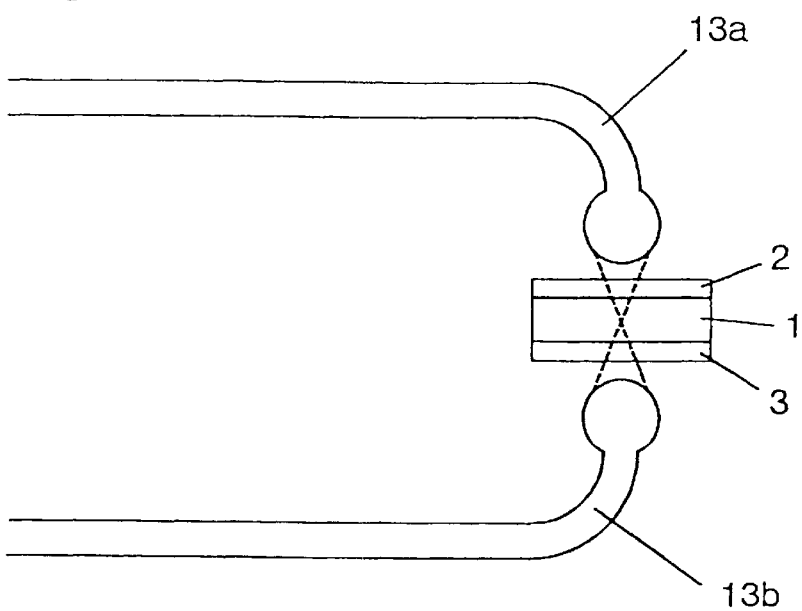
FIG. 5 is a diagram showing another embodiment of an optical magnetic field sensor probe according to the invention.

FIG. 5 is a diagram showing an optical magnetic field sensor probe according to a fourth embodiment of the invention. The optical magnetic field sensor probe in FIG. 5 differs from the optical magnetic field sensor in FIG. 1 in the omission of the lenses in order to decrease further the number of parts. Instead, bent hemispherical-ended optical fibers 13a, 13b, bent at the end to 90 degrees, are used as the input optical fiber and the output optical fiber. By using the bent hemispherical-ended optical fibers 13, too, the sensor optical system is composed in a confocal optical system the same as in embodiment 1 and embodiment 2. By this arrangement, a 6 mm wide small optical magnetic sensor probe of high precision can be manufactured.

Embodiment 5

Figure 6:
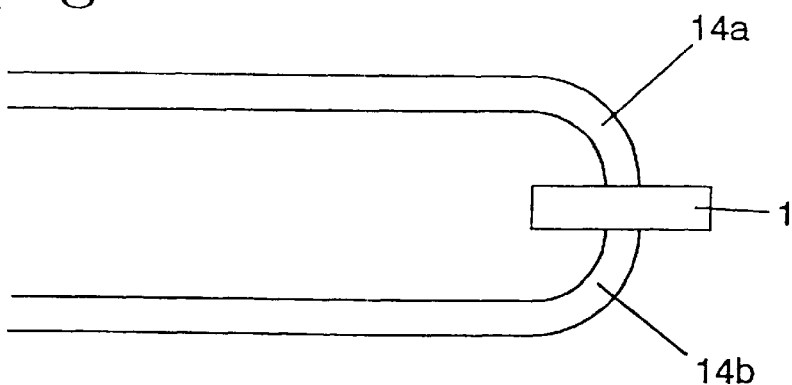
FIG. 6 is a diagram showing yet another embodiment of an optical magnetic field sensor probe according to the invention.

FIG. 6 is a diagram showing an optical magnetic field sensor probe according to a fifth embodiment of the invention. The optical magnetic field sensor probe in FIG. 6 differs from the sensor in FIG. 1 in the omission of the lenses, polarizer and analyzer in order to decrease the number of parts further and to decrease the width of the head, and in that the front end bent optical fibers 14a and 14b having a function of holding the plane of polarization are used as the input optical fiber 14a and the output optical fiber 14b. The planes of polarization of the input optical fiber 14a and the output optical fiber 14b are disposed by mutually rotating them by 45 degrees. The width of the thus fabricated optical magnetic field sensor probe is only 4 mm, and the size is therefore very small.

In this embodiment, the same performance can be exhibited if the optical fibers are optical fibers having a function for holding the plane of polarization by adding a polarizing plate to the front end of the bent optical fibers, instead of using the optical fibers alone for holding the plane of polarization.

Embodiment 6

Figure 7:
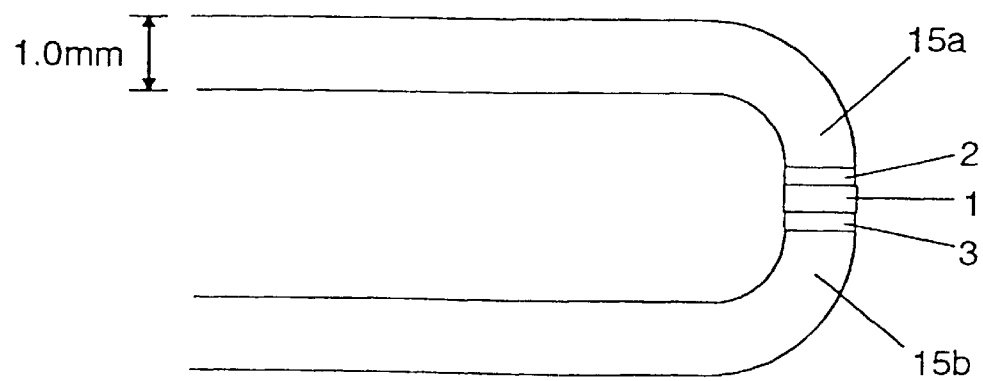
FIG. 7 is a diagram showing still another embodiment of an optical magnetic field sensor probe according to the invention.

FIG. 7 is a diagram showing an optical magnetic field sensor probe according to a sixth embodiment of the invention. The optical magnetic field sensor probe in FIG. 7 differs from the sensor in FIG. 1 in the use of plastic optical fiber (POF) 15, bent at the front end, as the optical fiber in order to enhance the SNR characteristic and linearity. Generally, the POF is very large in core diameter, being about 1 mm, and the quantity of light received in the photodetector is large. Besides, with a large core diameter, the diffracted light generated when using rare earth iron garnet material in the magneto-optical device 1 can be received up to a high order. Thus, by using the POF, the quantity of received light in the optical magnetic field sensor probe is large, so that the SNR characteristic of the sensor is further enhanced.

In embodiment 5 and embodiment 6, in order to shorten the distance between the input optical fiber and output optical fiber, a glass polarizing plate of a thin film thickness or a rare earth iron garnet film is used, which is reduced in film thickness by omitting the SGGG substrate. Thus, the input light diffracted by the multiple domain structure of the rare earth iron garnet material can be received up to a high order by the output optical fiber, so that an optical magnetic sensor probe of further excellent linearity can be composed.

Figure 8:
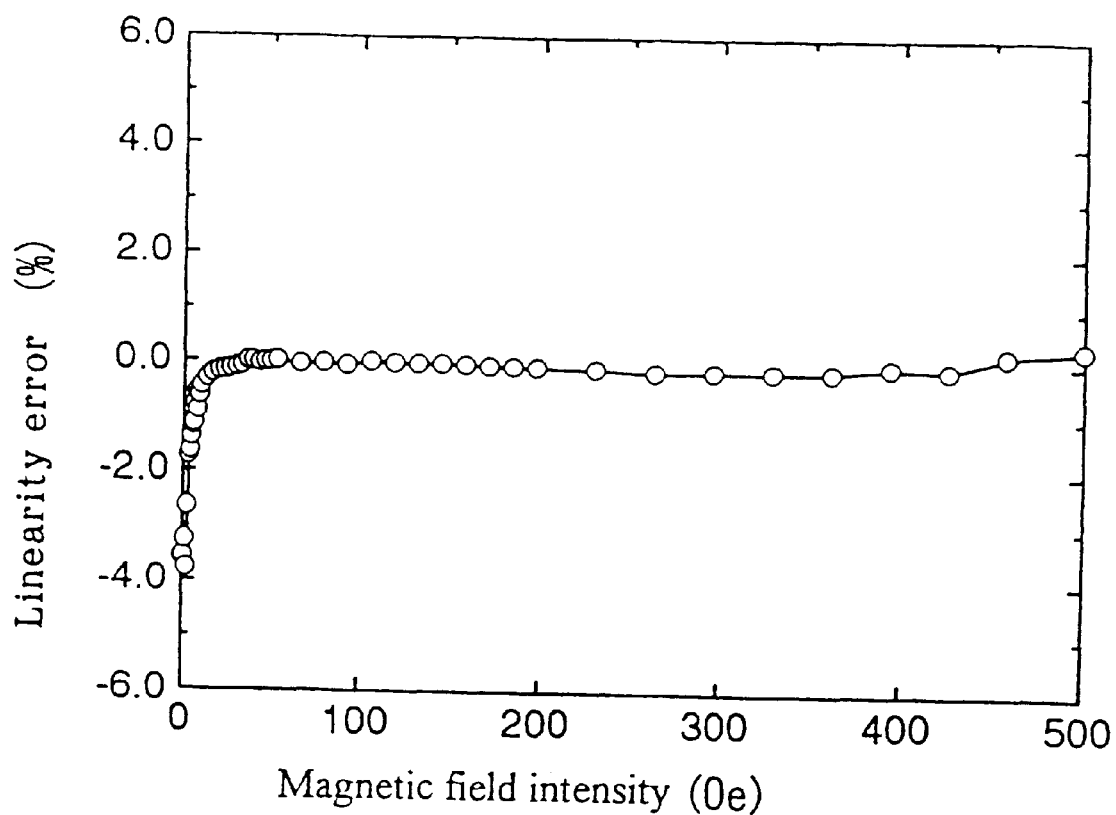
FIG. 8 is a diagram showing the linearity of an optical magnetic field sensor probe according to the invention.
Figure 17:
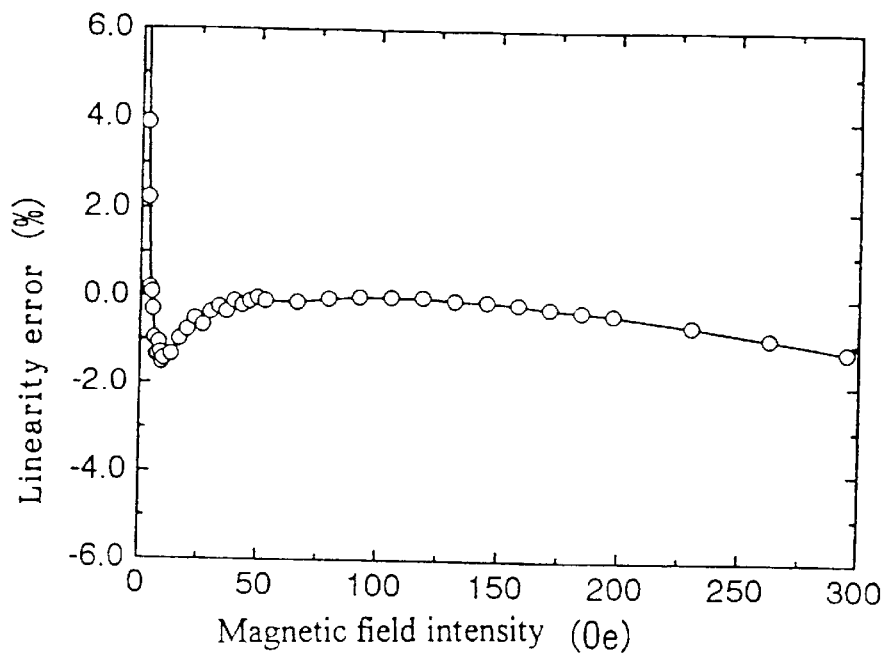
FIG. 17 is a diagram showing the linearity of a conventional optical magnetic field sensor.

Results of the linearity of the optical magnetic field sensor probes of embodiment 1 to embodiment 6 are shown in FIG. 8. As clear from FIG. 8, the optical magnetic field sensor probes of the embodiments present excellent linearity in a wider magnetic field range by 200 Oe than in the prior art shown in FIG. 17, and the linearity error is only 1.0% or less in a magnetic field range of up to 500 Oe.

Figure 10:
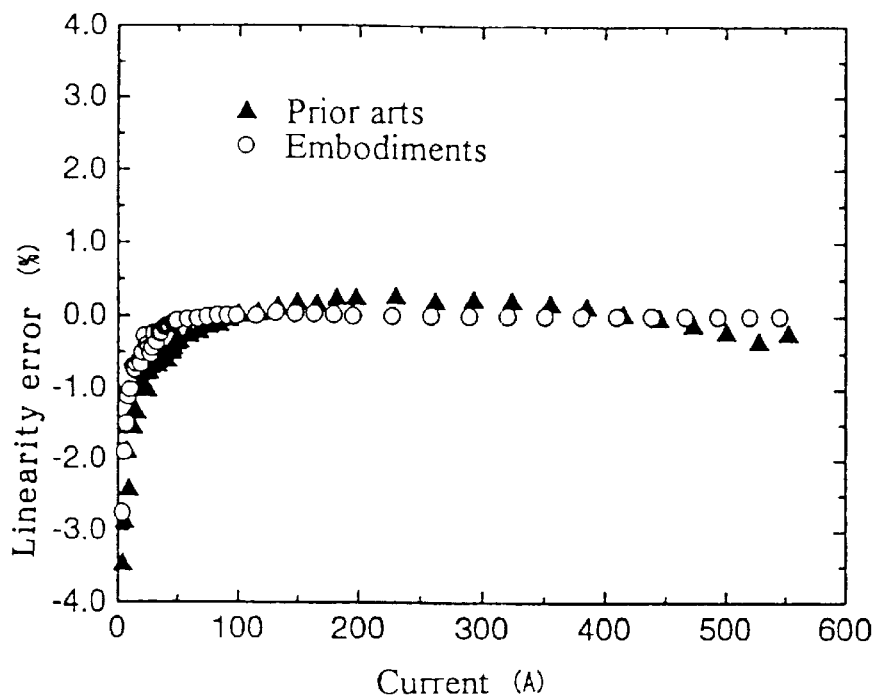
FIG. 10 is a diagram showing the linearity of an optical transformer using an optical magnetic field sensor probe according to the invention.
Figure 11:
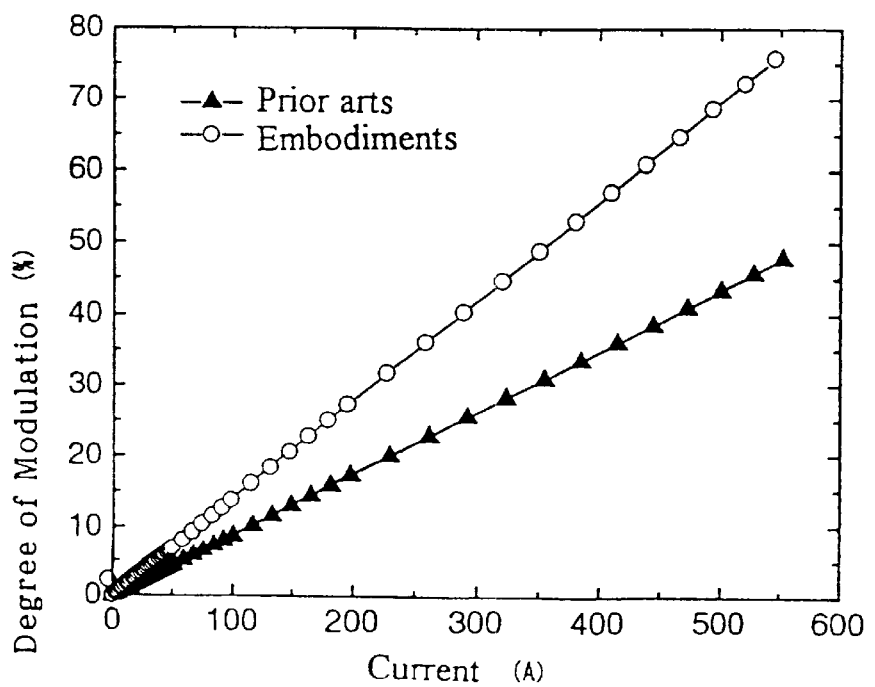
FIG. 11 is a diagram showing the sensitivity of an optical transformer using an optical magnetic field sensor probe according to the invention.

Next, these optical magnetic field sensor probes were put in the gaps of void iron cores, and optical transformers were thus composed. The structure is shown in FIG. 9. Herein, reference numeral 16 is an iron core, 17 is an optical magnetic field sensor probe, 18 is a signal processing circuit, and 19 is a conductor. When used as the optical transformer, the results of measurement of linearity and sensitivity are shown respectively in FIG. 10 and FIG. 11. Measured data of conventional optical transformer is also provided, and it is known that both linearity and sensitivity are much improved by reducing the size. In FIG. 9, the optical transformer is composed by using the iron core 16, but by installing the optical magnetic field sensor probe directly in the conductor without using the iron core, it was also possible to measure sufficiently.

Embodiment 7

Figure 12:
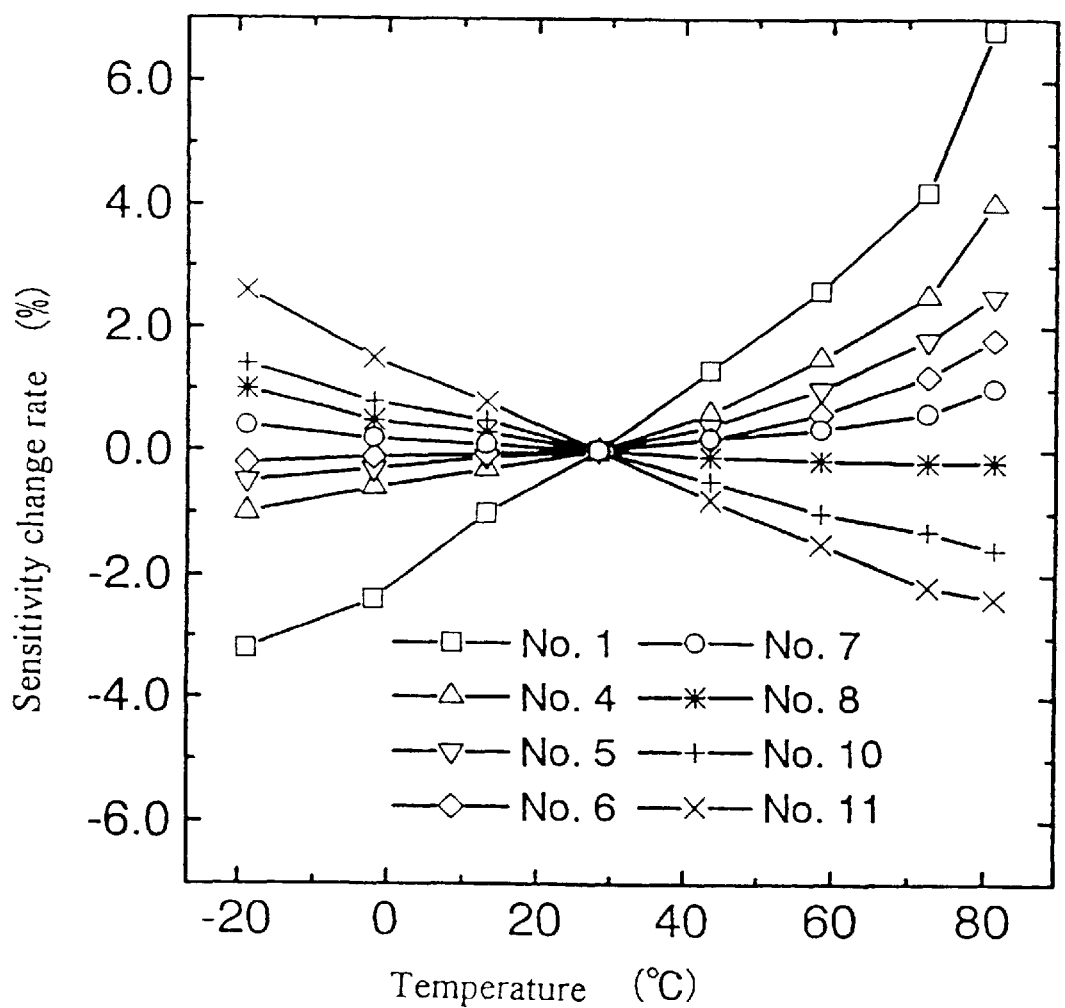
FIG. 12 is a diagram showing the temperature characteristic of an optical magnetic field sensor probe according to the invention.

An embodiment of a magneto-optical device of the invention is described below by referring to the diagrams and a table. Table 1 is a composition table showing a seventh embodiment of the invention. Using a $Bi_2O_3$—$PbO$—$B_2O_5$ flux, a rare earth iron garnet material expressed in formula I was formed on a Ca—Mg—Zr substituted $Gd_3Ga_5O_2$ substrate by crystal growth by the LPE method. The numerical value shows the ratio in composition of each element. To evaluate the temperature characteristic of the magneto-optical devices shown in Table 1, the magneto-optical devices were used in the optical magnetic field sensor probe shown in FIG. 2, and changes of sensitivity depending on temperature were measured in a magnetic field range below the saturation magnetic field of the magneto-optical device. The change rate of sensor sensitivity is shown in Table 1. The frequency of the alternating-current magnetic field is 60 Hz. The samples with # marked in the temperature characteristic in Table 1 are those outside the scope of the invention. As for the asterisked samples in Table 1, the measured data of changes of sensitivity depending on temperature are shown in FIG. 12.

TABLE 1

| Sample No | Composition of rare earth iron garnet material | | | | | | Change rate of sensor sensitivity (−20 to +80° C.) |
|---|---|---|---|---|---|---|---|
| | Bi x | Ged y | La z | Y 3-x-y-z | Fe 5-w | Ga w | |
| *1 | 1.27 | 0.12 | 0.12 | 1.49 | 4.41 | 0.59 | #10.0% |
| 2 | 1.20 | 0.45 | 0.08 | 1.27 | 4.55 | 0.45 | #8.0% |
| 3 | 1.15 | 0.55 | 0.05 | 1.25 | 4.65 | 0.35 | #6.0% |
| *4 | 1.13 | 0.64 | 0.03 | 1.20 | 4.73 | 0.27 | #5.0% |
| *5 | 1.10 | 0.73 | 0.03 | 1.14 | 4.73 | 0.27 | 3.0% |
| *6 | 1.05 | 0.81 | 0.03 | 1.11 | 4.73 | 0.27 | 2.0% |
| *7 | 0.98 | 0.92 | 0.03 | 1.07 | 4.72 | 0.28 | 1.0% |
| *8 | 0.92 | 1.00 | 0.02 | 1.06 | 4.71 | 0.29 | 1.2% |
| 9 | 0.85 | 1.10 | 0.02 | 1.03 | 4.71 | 0.29 | 2.0% |
| *10 | 0.85 | 1.22 | 0.02 | 0.92 | 4.68 | 0.32 | 3.0% |
| *11 | 0.80 | 1.31 | 0.02 | 0.87 | 4.65 | 0.35 | #5.0% |

Figure 18:
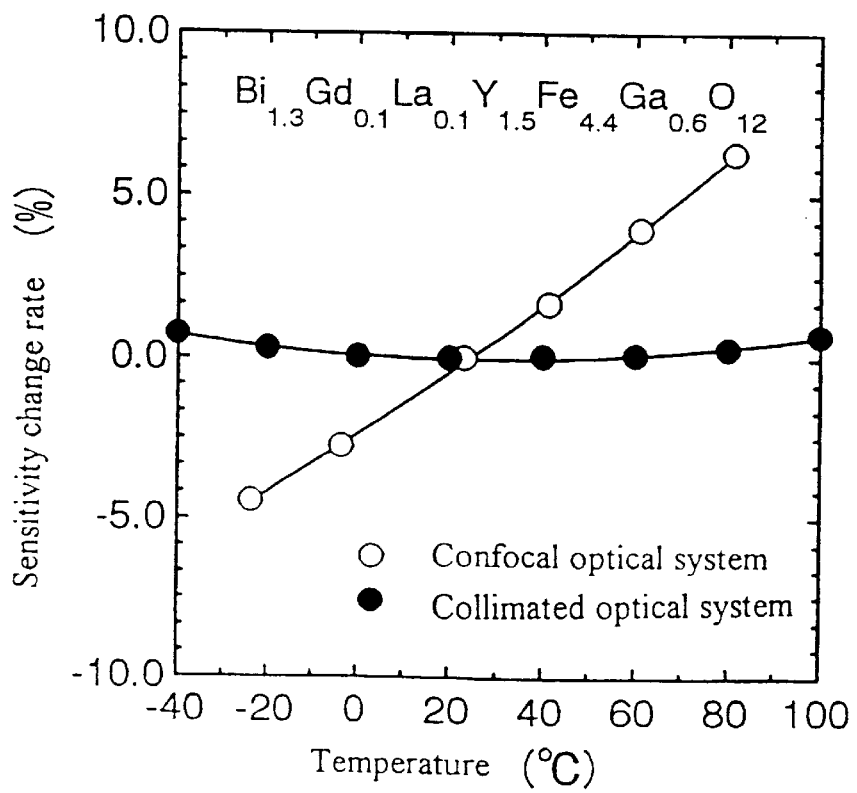
FIG. 18 is a diagram showing the temperature characteristic of a conventional optical magnetic field sensor.

The magneto-optical device of the invention is expressed in formula 1, and when the crystal composition is specified by the value of x defined in a range of $0.84 \leq x \leq 1.10$, the value of y in a range of $0.73 \leq y \leq 1.22$, the value of z in a range of $0.02 \leq z \leq 0.03$, and the value of w in a range of $0.27 \leq w \leq 0.32$, in the temperature range of −20° C. to +80° C., changes of sensitivity depending on temperature settled within 3.0% (within ±1.5%). As compared with the blank circle mark in FIG. 18 relating to the prior art, it is known that the temperature characteristic is extremely improved. Still more, since the magneto-optical devices in Table 1 are used in the optical magnetic field sensor probes employing the confocal optical system shown in FIG. 1 to FIG. 5, the linearity of the output was evaluated, and an excellent linearity of 1.0% or less was shown up to about 500 Oe of the saturation magnetic field of the rare earth iron garnet material. Also, when applied in the optical magnetic field sensor probe using bent fibers in FIG. 6 and FIG. 7 capable of receiving diffracted light of high order, similarly, an excellent temperature characteristic was exhibited.

The fundamental theory for obtaining such favorable results is as follows. In the optical magnetic field sensor probe composed of an optical system for receiving diffracted light of 0th order only by a magneto-optical device, the DC component VODC and AC component VOAC of the sensor output are expressed in the following equations. Herein, the values are standardized with the proportional constant defined as 1.

$$V_{ODC} = A + (\tfrac{1}{2})CH_{IN}^2 \quad \text{(Equation 1)}$$

$$V_{OAC} = BH_{IN}\sin\omega t + (\tfrac{1}{2})CH_{IN}^2 \sin(2\omega t - \pi/2) \quad \text{(Equation 2)}$$

where constants A, B, C are $$A = \cos^2\theta_F/2,\ B = \cos\theta_F \sin\theta_F)/Hs,\ C = \sin^2\theta_F/2Hs^2, \quad \text{(Equation 3)}$$

$\theta_F$ is the Faraday's rotational angle, and Hs is the saturation magnetic field. The degree of modulation $m_0$ of the optical magnetic field sensor for receiving diffracted light of the 0th order only being composed of rare earth iron garnet material to the fundamental wave is defined by $V_{OAC}/V_{ODC}$, and is hence determined from equation 1 and equation 2. The degree of modulation $m_0$ to the output fundamental wave w is expressed as follows as the function of temperature T:

$$m_0(T) = B(T)H_{IN}/(A(T) + C(T)H_{IN}^2/2 \quad \text{(Equation 4)}$$

On the other hand, in the optical magnetic field sensor composed of an optical system for receiving diffracted light of all orders being composed of a magneto-optical device, its output DC component $V_{allDC}$ and AC component $V_{allAC}$ are expressed as follows:

$$V_{allDC} = \tfrac{1}{2} \quad \text{(Equation 5)}$$

$$V_{allAC} = 2BH_{IN},\ 2B = \sin 2\theta_F/Hs \quad \text{(Equation 6)}$$

Therefore, the degree of modulation $m_{all}$ of the optical magnetic field sensor for receiving light of all orders is expressed as follows as the function of temperature T:

$$m_{all}(T) = 4B(T)H_{IN} \quad \text{(Equation 7)}$$

From equation 4 and equation 7, once the composition of the garnet material being used as the magneto-optical device is determined, the constants A, B, C and their temperature changes are determined, and hence it is evident that the temperature dependence of the sensitivity of the optical magnetic field sensor is determined automatically. Therefore, as in the embodiments shown in Table 1, mainly by changing the substitution concentration of element Gd, it is possible to determine the composition of the rare earth iron garnet material with a small temperature dependent change of sensitivity, in the optical magnetic field sensor probe for receiving diffracted light of high order.

Moreover, from equation 7, receiving light in all orders, it is known that the temperature dependence of sensitivity does not depend on the applied magnetic field. In other words, in the conventional sensor optical system for receiving light of the 0th order only, if the composition of the rare earth iron garnet material is determined for minimizing the temperature dependent change of sensitivity according to equation 4 at a certain magnetic field intensity, since the square term of the magnetic field is included, if the applied magnetic field is changed, the temperature dependence of the sensitivity is also changed. Therefore, by receiving diffracted light of up to a high order, it is considered possible to realize an optical magnetic field sensor not varying in linearity due to temperature.

Accordingly, when employing a sensor optical system for receiving diffracted light of high orders, in order to enhance the measuring precision of the optical magnetic field sensor probe using rare earth iron garnet material as the magneto-optical device, it is necessary to improve the composition of the rare earth iron garnet material in the same manner as in the embodiment. The elements for replacing the rare earth elements are not limited to the combination of Bi+Gd+La+Y as in embodiment 7 in Table 1, but may include other substitution combinations for which it is easy to control the temperature characteristic disclosed so far. For example, combinations of rare earth elements Bi+Gd+Y, Bi+Gd, Bi+Tb, Bi+Yb+Tb, Bi+Y+Tb, Bi+Eu+Ho, Bi+Nd+Tb, Bi+Ho+Tb, Bi+Er+Pb, etc., and further element Fe combined with elements replacing at least one selected from the group consisting of Ga, Al, Sc, In, and Pt, can be used with such rare earth iron garnet material having such combinations, it is possible to compose the optical magnetic field sensor probe or sensors using bent optical fibers, decreased in temperature characteristic of sensitivity and excellent in linearity, in the same manner as in the invention.

In embodiment 7, meanwhile, La is used as the element for replacing for the purpose of lattice matching, but it is also possible to use one or more rare earth elements in the element R in formula 1. At this time, a non-magnetic material having no effect on the saturation magnetization of the rare earth iron garnet material brings about favorable results. Alternatively, if other than a Ca—Mg—Zr substituted $Gd_3Ga_5O_{12}$ crystal substrate differing in lattice constant is used as the garnet crystal substrate, for lattice matching, replacing the element R in formula 1 with one or more rare earth elements allows a rare earth iron garnet material of excellent linearity and temperature characteristic to be grown.

Incidentally, this improvement of linearity and temperature characteristic was recognized not only with a light source in the 0.8 μm band, but also at other wavelengths in the 1.3 μm band or the 1.5 μm band for passing through rare earth iron garnet material. Further, not only at a frequency of 60 Hz, but also from a DC magnetic field to hundreds of MHz, the magnetic field could be measured at high precision. These were the results produced by growing the magneto-optical device on the Ca—Mg—Zr substituted $Gd_3Ga_5O_{12}$ crystal substrate (SGGG crystal substrate), but similar results were obtained by varying the growth conditions on a $Nd_3Ga_5O_{12}$ substrate. It was also possible to grow the material epitaxially on these substrates by the vapor phase growth method.

In any growth method, depending on the growth conditions, the rare earth iron garnet material expressed in formula 1, and having the crystal composition with the value of x defined in a range of $0.84 \leq x \leq 1.10$, the value of y in a range of $0.73 \leq y \leq 1.22$, the value of z in a range of $0.02 \leq z \leq 0.03$, and the value of w in a range of $0.27 \leq w \leq 0.32$, may be formed as a polycrystal without epitaxial growth, and such a polycrystal magneto-optical device can be sufficiently used although the light absorption loss is sightly larger.

Embodiment 8

Figure 13:
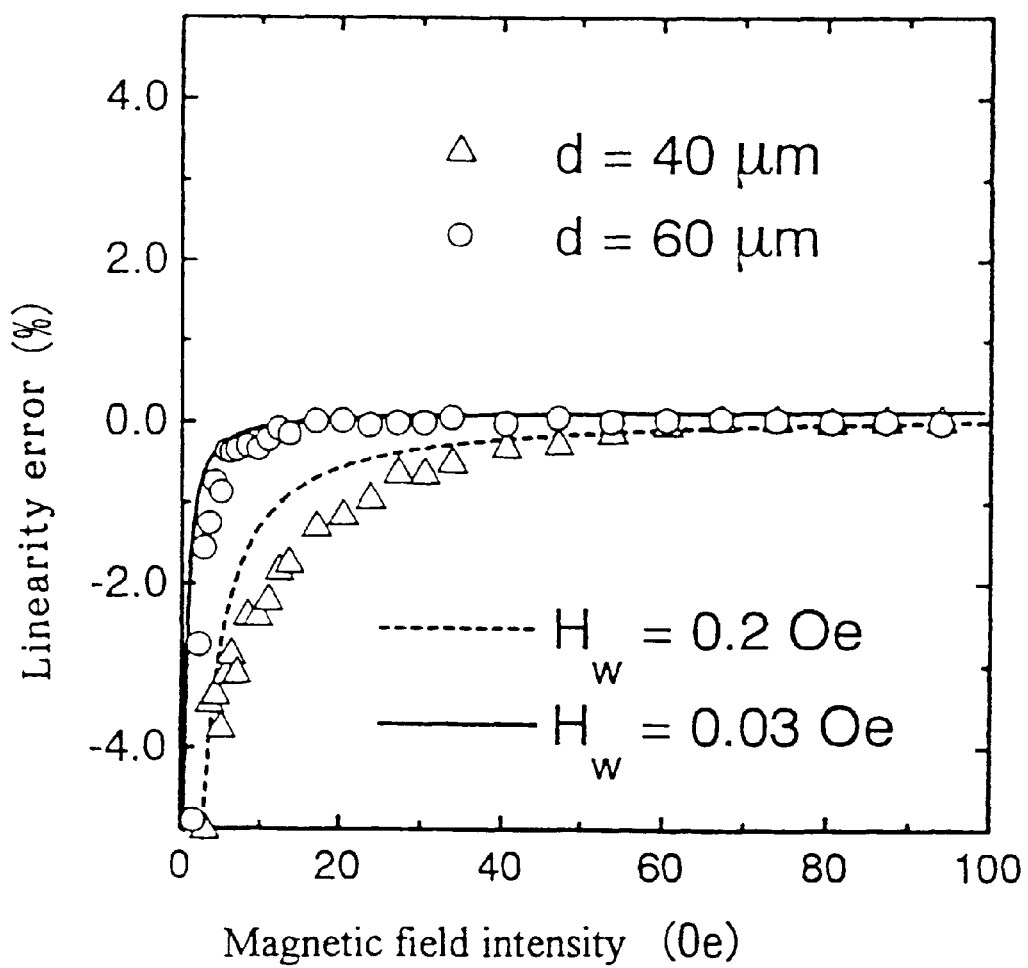
FIG. 13 is a diagram showing the dependence of linearity error on the magnetic wall coercive force of an optical magnetic field sensor probe according to the invention.

An eighth embodiment of the invention is described below by referring to the accompanying drawings. It is a feature of this embodiment that the magnetic wall coercive force is 0.2 Oe or less. FIG. 13 shows the relation of the film thickness dependence to the magnetic wall coercive force (Hw), concerning the linearity of the optical magnetic field sensor probe in the weak magnetic field of the eighth embodiment of the invention. That is, the linearity in the weak magnetic field of the optical magnetic field sensor probe capable of receiving diffracted light from the 0th order to a high order as shown in FIG. 1 or FIG. 2 is shown to depend greatly on the film thickness (d) of the magneto-optical device to be used. As the film thickness of the magneto-optical device increases, it is known that the linearity error in the weak magnetic field is extremely improved.

The fundamental reasons for obtaining such favorable results are described below. The probable causes of linearity error in the sensor output are (1) the effect of receiving orders of diffracted light, (2) the non-linearity of the magnetization curve of rare earth iron garnet material, and (3) the large magnetic wall coercive force of rare earth iron garnet material, and at the high magnetic field side, mainly (1) the effect of the light receiving condition of the diffracted light is considered to be significant.

Figure 14A:
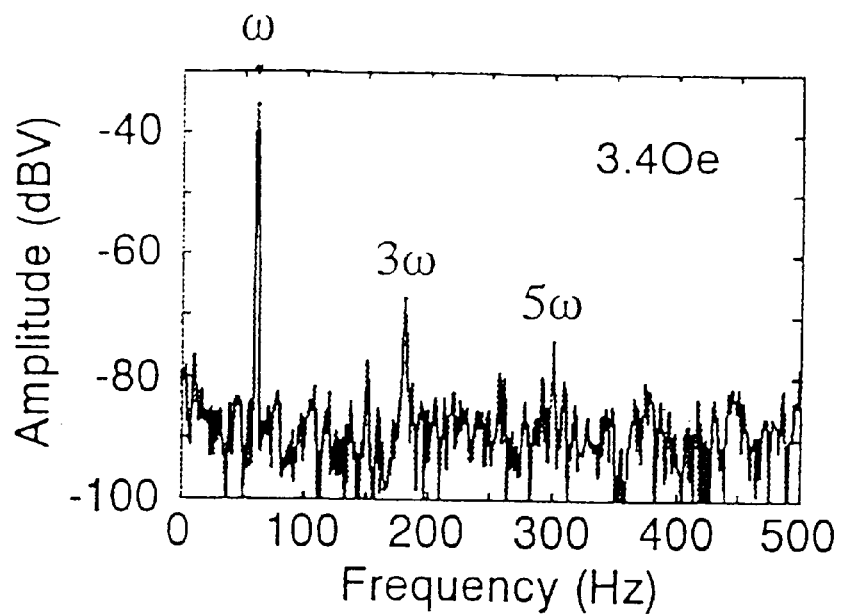
FIG. 14(a) is a diagram showing a frequency spectrum at 3.4 Oe of an optical magnetic field sensor according to the invention.
Figure 14B:
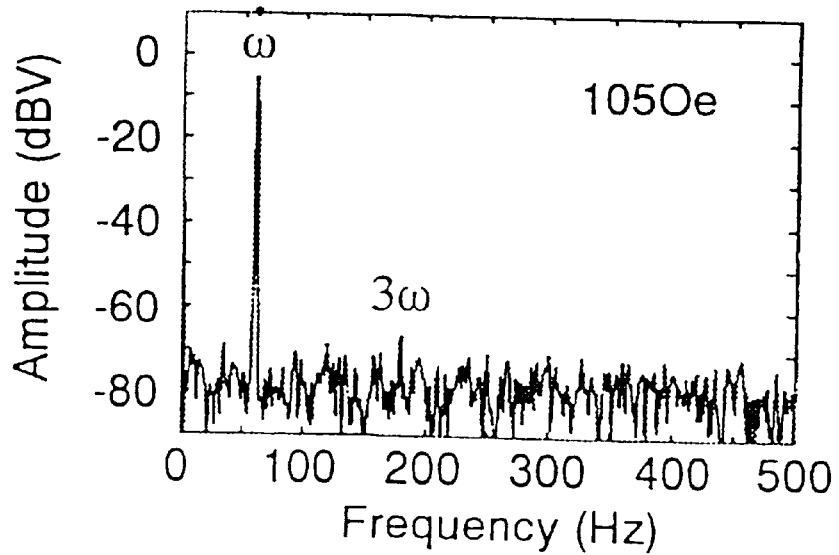
FIG. 14(b) is a diagram showing a frequency spectrum at 105 Oe of an optical magnetic field sensor according to the invention.

Accordingly, improvement of linearity in the low magnetic field region is specifically described below from the viewpoint of linearity error. In a low magnetic field region of 20 Oe or less where a negative linearity error is large, the frequency of the sensor output was analyzed. As a result, in the low magnetic field, both the fundamental wave ($\omega$) and the third harmonic wave ($3\omega$) were observed. The frequency spectra of the sensor output observed in applied magnetic fields of 3.4 Oe and 105 Oe are shown in FIGS. 14(a) and 14(b). From FIG. 14(a), $3\omega$ became the same level as the noise shown in FIG. 14(b) as the applied magnetic field increased, and substantially there was no effect on the linearity of the sensor output. Generally, when harmonic waves of an odd-number order of fundamental waves are generated, it is considered that a hysteresis loop is present at the input and output side. The cause of this third harmonic wave is mainly (3), i.e., the large magnetic wall coercive force of BiRIG crystal, among the three factors mentioned above. When Hw is large, the magnetic wall hardly moves in the very weak magnetic field of less than Hw, and the sensor output does not change linearly. That is, the smaller the value of Hw, the better considered the linearity of the sensor output in the low magnetic field. Therefore, to decrease the linearity error in the low magnetic field region, it is known to decrease the Hw of the rare earth iron garnet material.

Hence, fabricating optical magnetic field sensor probes by using rare earth iron garnet materials of different film thicknesses, the linearity was measured. The results are shown in FIG. 13. Herein, plotted points are measured values, and the broken line and solid line are linearity error curves calculated by using the value of Hw determined from the measured results. The value of Hw (peak value) was determined by extrapolating the linear portion of the graph plotting the sensor output values in the applied magnetic field, to zero of the sensor output value, and the value of Hw=0.2 Oe was obtained at 40 $\mu$m, and Hw=0.03 Oe at 60 $\mu$m. The linearity error curve was calculated on the basis of the following equation 8, in consideration of the term of Hw in equation 7 of the degree of modulation $m_{all}$ of the magnetic field sensor for receiving light in all orders.

$$m_{all}=0, Ho<Hw$$

$$m_{all}=4B \times (Ho-Hw), Ho \geq Hw \quad \text{(Equation 8)}$$

It is known from this embodiment that the negative linearity error is decreased notably in the low magnetic field at the film thickness of 60 $\mu$m. By using the rare earth iron garnet material of the thicker film thickness of 80 $\mu$m, too, the linearity error in the low magnetic field was decreased. On the other hand, the calculated value determined by considering Hw coincided very well with the measured value, and it is known that the linearity error curve depends greatly on the value of Hw.

To measure at a precision of 1.0% or less in a magnetic field of 20 Oe or less, FIG. 13 tells it that is enough to use the magneto-optical device having a value of Hw is 0.2 Oe or less from the theoretical formula in equation 8 and experiment. Moreover, the smaller the value of Hw, it is confirmed, the more decreased is the linearity error in the low magnetic field. The magneto-optical device used in FIG. 13 is a rare earth iron garnet material expressed in formula 1, but this film thickness dependence of the magnetic wall coercive force is considered to be applicable to all magneto-optical devices having magnetic domains.

Embodiment 9

A ninth embodiment of the invention is described below while referring to the accompanying drawings. A feature of the ninth embodiment lies in the heat treatment of the magneto-optical device, and it makes use of the effect of the heat treatment on the linearity in a low magnetic field.

Figure 15A:
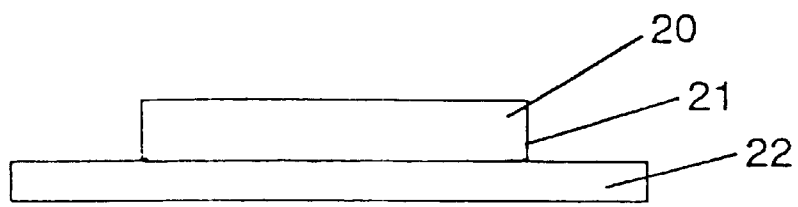
FIG. 15(a) is a side view showing a heat treatment method of a magneto-optical device according to the invention.
Figure 15B:
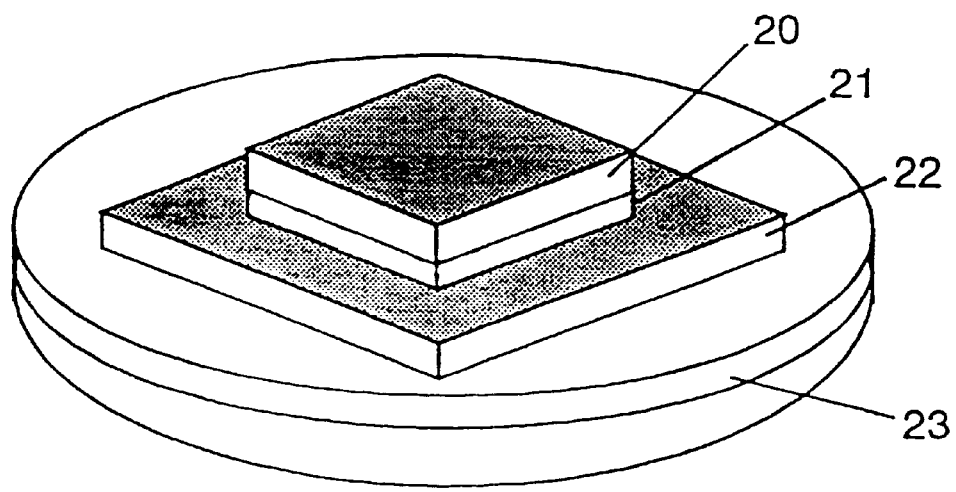
FIG. 15(b) is a perspective view showing a heat treatment method of a magneto-optical device according to the invention.
Figure 16B:
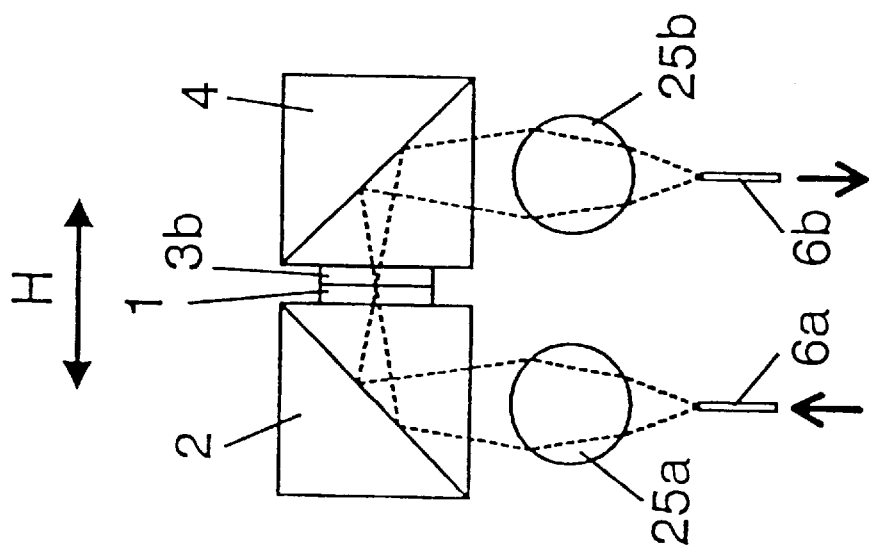
FIG. 16(b) is a diagram showing an internal structure of an optical magnetic field sensor using a conventional confocal optical system.
Figure 16A:
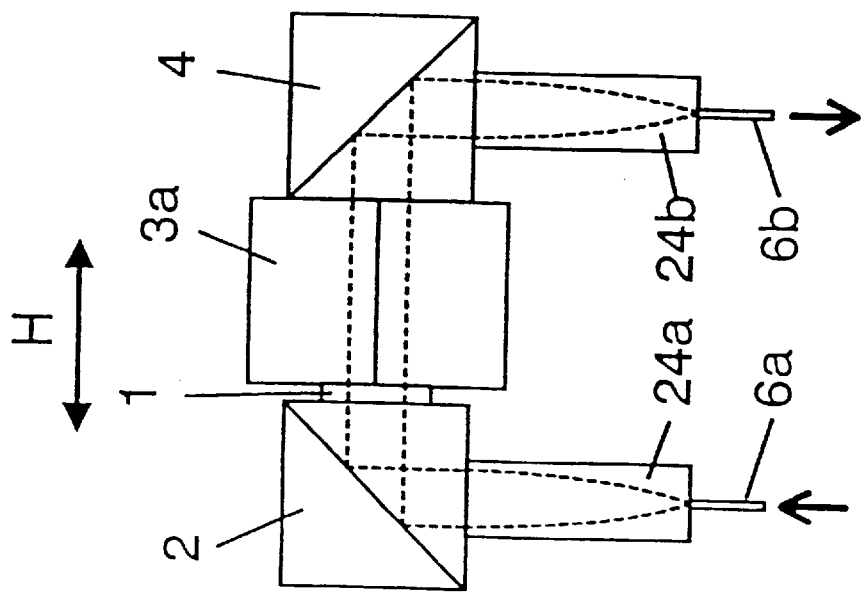
FIG. 16(a) is a diagram showing an internal structure of an optical magnetic field sensor using a conventional collimated optical system.

That is, by proper heat treatment of the rare earth iron garnet material expressed in formula 1, it is known that the linearity error in the low magnetic field region is decreased. The heat treatment is conducted in an electric furnace, by placing the rare earth iron garnet material expressed in formula 1, as shown in FIG. 15, on a ceramic tray 23 by contacting with the growth surface of the rare earth iron garnet material 21 on the SGGG crystal 22 used in the substrate 20. Unless the growth surface is covered in this manner, heat treatment fails, and the film surface of the rare earth iron garnet material will be damaged and broken. The heat treatment temperature was 900° C., 950° C., 1000° C., 1050° C., and 1100° C., and at each temperature, the heat treatment time was 5 hours, 10 hours, 15 hours, 20 hours, and 25 hours, in order to evaluate the dependence on time. The surface state of the rare earth iron garnet material after heat treatment was observed by using an optical microscope. In the heat treatment time of 10 hours, and at the heat treatment temperature of 900° C. to 1000° C., there was no particular change in the crystal surface, but at 1100° C., the film surface was damaged at several positions. At 1200° C., it was known that the film was broken.

Using the heat treated rare earth iron garnet material, the optical magnetic field sensor probe shown in FIG. 2 was fabricated, and the linearity was measured. Results are shown in Table 2 and Table 3. Table 2 shows the results of measurement of sensor output linearity error and magnetic wall coercive force by varying the heat treatment temperature, and Table 3 shows the results of measurement of linearity error and magnetic wall coercive force by varying the heat treatment time. In the tables, the linearity error denotes the low magnetic field characteristic in the magnetic field range of 20 Oe or less, and the x mark shows failure in measurement due to damage of the film.

TABLE 2

|  | 900° C. | 950° C. | 1000° C. | 1050° C. | 1100° C. |
| --- | --- | --- | --- | --- | --- |
| Linearity error (%) | ≦1.5 | ≦1.2 | ≦1.0 | ≦0.5 | x |
| Magnetic wall coercive force (Oe) | 0.35 | 0.3 | 0.2 | 0.05 | x |

(Annealing time: 20 hours)

TABLE 3

|  | 5 hours | 10 hours | 15 hours | 20 hours | 25 hours |
| --- | --- | --- | --- | --- | --- |
| Linearity error (%) | ≦1.5 | ≦1.2 | ≦1.0 | ≦0.5 | x |
| Magnetic wall coercive force (Oe) | 0.3 | 0.2 | 0.1 | 0.05 | |

(Annealing temperature: 1050° C.)

It is known that the linearity error at 20 Oe or less is decreased as the heat treatment temperature is higher (Table 2) and the heat treatment time is longer (Table 3). However, if heated for more than 25 hours at a higher temperature than 1100° C., the film of the rare earth iron garnet material expressed in formula 1 is damaged and broken, and an optical magnetic field sensor probe cannot be composed. Therefore, from the observation of the surface state after heat treatment and the above results, to realize a linearity error of 1.0% or less, it is appropriate to heat the material at 1000° C. to 1050° C. for 15 hours or more, and control the magnetic wall coercive force to be under 0.2 Oe.

As clear from the description herein, according to the magneto-optical device and sensor optical system of the invention, excellent linearity and a superior temperature characteristic are realized over a wider magnetic field range than in the prior art, and an optical magnetic field sensor probe of small size and high reliability capable of measuring magnetic fields at high precision can be presented.

What is claimed is:

1. An optical magnetic field sensor probe for detecting a magnetic field, comprising:

an input optical fiber for inputting light into the optical magnetic field sensor probe, a first drum lens, a polarizer, a magneto-optical device, an analyzer, a second drum lens, an output optical fiber for emitting light from the optical magnetic field sensor probe, and one lens holder disposed to hold both the first drum lens and the second drum lens, the input optical fiber, the first drum lens, the polarizer, the magneto-optical device, the analyzer, the second drum lens and the output optical fiber being arranged in order along a light path such that the input optical fiber, the first drum lens, the magneto-optical device, the second drum lens and the output optical fiber together form a confocal optical system, the analyzer has transmission and polarization directions that are different than the polarizer, and the first drum lens and the polarizer are axially symetrical about an axis through the magneto-optical device with the second drum lens and the analyzer, and wherein the lens holder has first and second holes therein with the first hole receiving the first drum lens and the input optical fiber so that an optical axis of the first drum lens coincides with an optical axis of the input optical fiber, and the second hole receiving the second drum lens and the output optical fiber so that an optical axis of the second drum lens coincides with an optical axis of the output optical fiber.

2. The optical magnetic field sensor probe of claim 1, wherein the first drum lens and the second drum lens each have a refractive index of 1.517 or more.

* * * * *